United States Patent [19]

Ono

[11] Patent Number: 5,780,943
[45] Date of Patent: Jul. 14, 1998

[54] EXPOSURE APPARATUS AND METHOD

[75] Inventor: Kazuya Ono, Yokohama, Japan

[73] Assignee: Nikon Corporation, Tokyo, Japan

[21] Appl. No.: 831,940

[22] Filed: Apr. 2, 1997

[30] Foreign Application Priority Data

Apr. 4, 1996 [JP] Japan ................. 8-108575
May 31, 1996 [JP] Japan ................. 8-161171

[51] Int. Cl.⁶ .................. H02K 41/00; F16F 15/03
[52] U.S. Cl. .................. 310/12; 248/638; 310/90.5
[58] Field of Search .................. 310/12, 13, 14, 310/90.5; 318/135, 649; 248/638

[56] References Cited

U.S. PATENT DOCUMENTS

3,493,275  2/1970  Stone et al. .................. 310/90.5
4,952,858  8/1990  Galburt .................. 318/647
5,294,854  3/1994  Trumper .................. 310/90.5

*Primary Examiner*—Steven L. Stephan
*Assistant Examiner*—Judson H. Jones
*Attorney, Agent, or Firm*—Nixon & Vanderhye PC

[57] ABSTRACT

A stage apparatus has a pair of permanent-magnets fixed to a magnet holder and a coil fixed to a coil holder and positioned between the permanent-magnets. When electric current is supplied to the coil, an attractive force is generated between the coil and the upper permanent-magnet, while a repulsive force is generated between the coil and the lower permanent-magnet, thereby moving the coil holder in the vertical direction relative to the magnet holder. When the attractive force and repulsive force act on the coil simultaneously, the resultant force has high linearity with respect to the electric current because the attractive force and the repulsive force cancel the nonlinear characteristics of each other.

31 Claims, 10 Drawing Sheets

EXPOSURE APPARATUS AND METHOD

BACKGROUND OF THE INVENTION

This invention relates to an exposure apparatus including a supporting stage with a driving apparatus and, more particularly, to an exposure apparatus including a supporting stage with a driving apparatus for moving an object linearly with a magnetic force, the stage apparatus having a table driven by the driving apparatus at least in a predetermined driving direction. The exposure apparatus may be a reduction projection type exposure apparatus, such as a stepper, or an electron beam exposure apparatus, which require precise positioning of a substrate.

In a microlithographic process for manufacturing a semiconductor device or liquid crystal display device, an electron beam exposure apparatus or an optical type projection exposure apparatus is used, in which a mask pattern is exposed to form a pattern image on a photosensitive substrate through a projection lens.

Recently, along with the development of highly integrated semiconductor circuitry, mask line interval requirements are getting stricter, as little as halfmicron in the order of sub micron. The resolution of the apparatus must be improved to realize such a dense line interval, and therefore, each shot area on the photosensitive substrate must be brought precisely into the image-forming plane of a projection lens, which has a greater numerical number N.A. (i.e., with a shallower focal depth). In general, the photosensitive substrate, such as a wafer, has been subjected to heat-treatment in previous steps, and the surface has become slightly uneven. To compensate, the substrate table, on which a photosensitive substrate is mounted, is made capable of moving along the optical axis of the projection lens and tilting with respect to a plane perpendicular to the optical axis to correct the vertical position and inclination of the substrate, so that each shot area is coincident with the image-forming plane of the projection lens.

Figure 1:
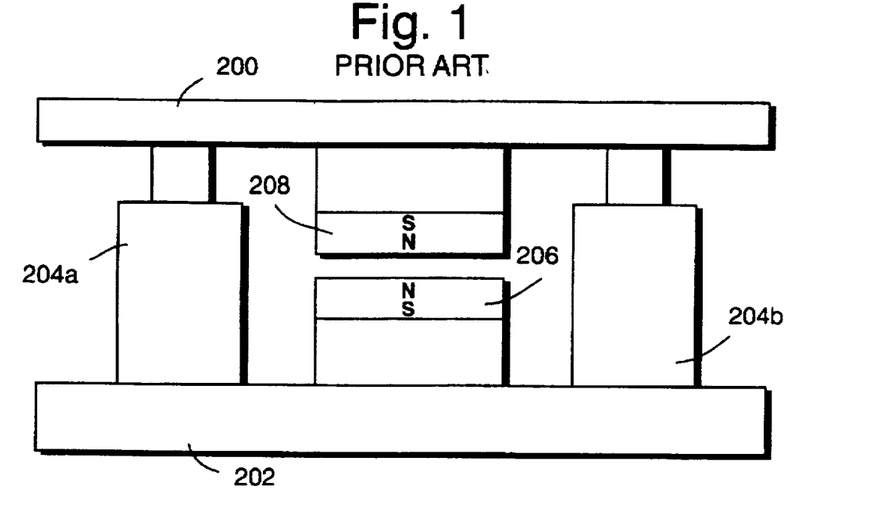
FIG. 1 illustrates a conventional stage supporting a table.

FIG. 1 illustrates a conventional stage 202. The stage 202 movably supports a table 200, on which a photosensitive substrate (not shown) is mounted, in a vertical direction. Driving units (204a, 204b), such as voice coil motors, and a pair of permanent-magnets 206, 208 are provided between the stage 202 and the table 200. The lower permanent-magnet 206 is fixed to the stage 202 with the N pole facing the table 200, while the upper permanent-magnet 208 is fixed to the bottom surface of the table 202 with the N pole facing the stage 202. Because the N poles of the permanent-magnets 206 and 208 are opposed to each other, a repulsive force is generated between the permanent-magnets 206 and 208, which supports the weight of the table 200. The driving units 204a and 204b drive the table 200 up and down (in the Z direction) as necessary. With this structure, the weight of the table is supported in a non-contacting manner.

It is difficult, however, for the conventional stage to maintain the repulsive force between the permanent-magnets 206 and 208. When the table 200 is moved up and down by the driving units 204a and 204b, the distance between the table 200 and the stage 202 changes, and therefore, the distance between the permanent-magnets 206 and 208 fixed thereto changes inevitably. As the distance between the permanent-magnets 206 and 208 changes, the repulsive force between the magnets 206 and 208 changes nonlinearly, as indicated by the solid line in FIG. 2. As the distance between the permanent-magnets 206 and 208 increases, the repulsive force supporting weight of the table decreases.

To avoid this effect, the change in the repulsive force between the permanent-magnets 206 and 208 may be corrected by the driving units 204a, 204b; however, this method causes power consumption to increase as well as the load on the driving units 204a 204b. In addition, the amount of heat generated from the stage increases, which may cause the table 200 to expand beyond an acceptable range, resulting in deteriorated positioning accuracy for the substrate mounted on the table.

Figure 3:
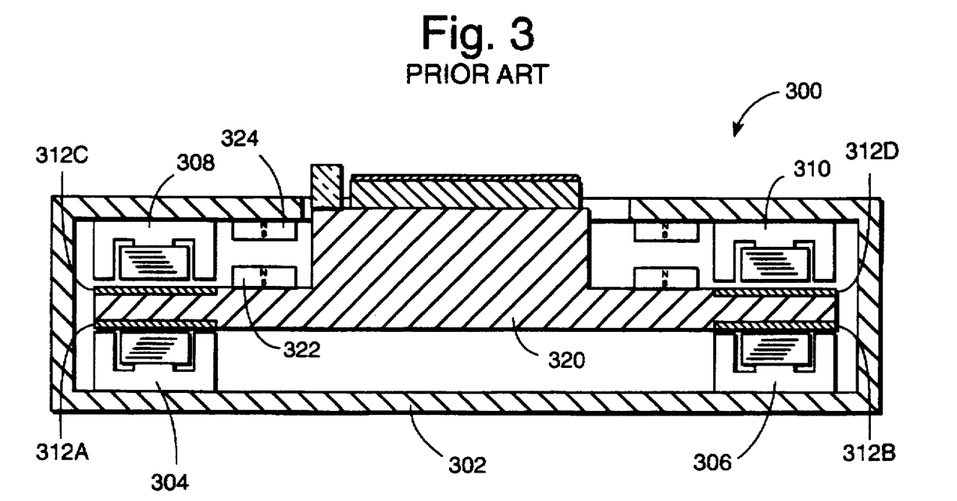
FIG. 3 is a cross-sectional view of an alternative conventional stage apparatus.

An alternative conventional arrangement is shown in FIG. 3. In this arrangement, the driving units consist of electromagnetic devices. The stage apparatus 300 has a hollow stage 302. Electromagnets 304, 306 having an E-shaped core are positioned inside the hollow stage 302 on both ends of the bottom face. Electromagnets 308, 310 having an E-shaped core are attached to the inner face of the top plate of the stage 302 opposed to the bottom electromagnets 304, 306. Iron plates (I-shaped cores) 312A, 312B, 312C, 312D are provided on the top and bottom surfaces of the substrate table 320 so that they face the electromagnets 304, 306, 308, 310, respectively. An electromagnet and an iron plate facing each other constitute an electromagnetic device. Two electromagnetic devices positioned on opposite sides of the substrate table 320 make a pair, and each pair of the electromagnetic devices moves the table 320 up and down, while controlling the magnitude of the attractive (or repulsive) force generated in the upper (or lower) electromagnetic devices. In actual use, multiple pairs of electromagnetic devices are provided on the top and bottom surfaces of the substrate table 320 to control the movement of the table 320 in the Z direction and to correct the inclination of the table 320. The weight of the table 320 is supported by the attractive force generated between the permanent-magnets 322 and 324.

Figure 2:
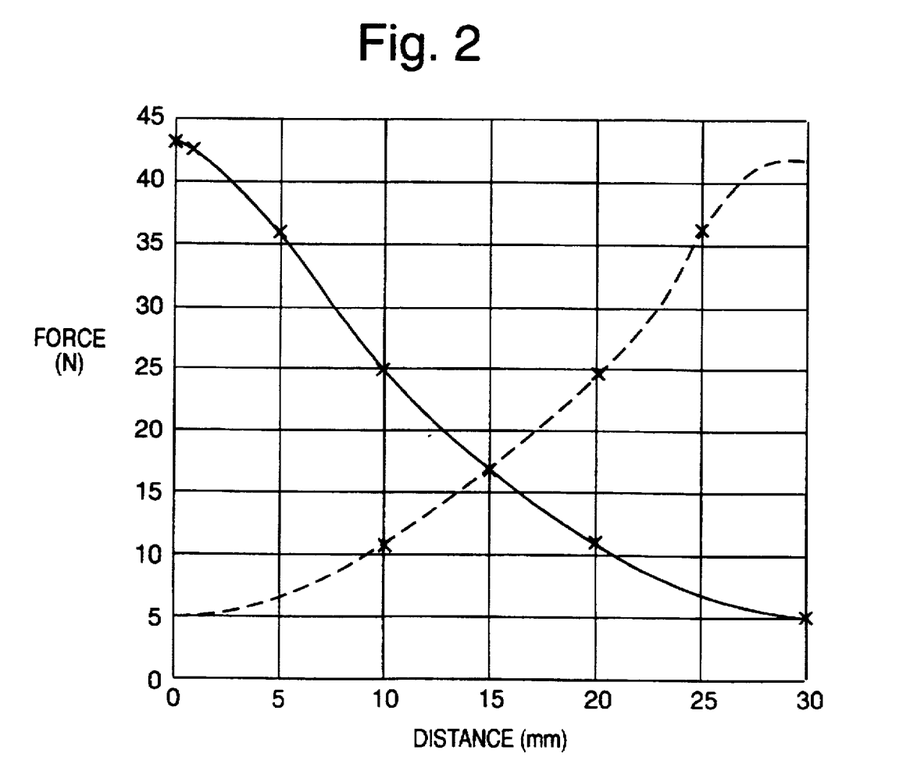
FIG. 2 is a graph plotting the repulsive force and attractive force as a function of distance, which is used to explain the functions of the invention and prior art technique.

There are several problems, however, in this conventional stage apparatus. As noted above, FIG. 2 shows the relation between the attractive force and the distance between the pair of permanent-magnets. If the attractive force of the electromagnetic device is used as the table driving force, the driving force changes nonlinearly depending on the vertical position of the table, even if constant electric current is supplied to the coils of the electromagnetic devices provided on the top and bottom faces of the table. This can be understood from FIG. 2 showing the relation between the attractive force and the distance between two permanent-magnets. With this method, it is difficult to precisely control the position of the table.

Moreover, in supporting the weight of the table, the attractive force (for supporting the weight of the table) between the two permanent-magnets changes as a function of the distance between the permanent-magnets, as indicated by the solid line of FIG. 2. Because the weight of the table is constant, any changes in the attractive force of the permanent-magnets must be corrected by the electromagnetic devices. The electromagnetic devices, however, are designed to simply move the table vertically or tilt the table. To correct the change in the attractive force, the electromagnetic devices require a complicated control technique. Furthermore, in order to support the table with a constant force, electric current must be always supplied to the coil of the electromagnet devices, which causes heat generation from the electromagnetic devices and thermal deformation of the table.

Additionally, because a plurality of electromagnetic devices must be provided on the top and bottom surfaces of the table, the size of the stage apparatus is increased. Cooling means can be provided to prevent heat generation from the electromagnetic devices, but make the table heavier and still larger. This is a fatal disadvantage for precise positioning of the table.

Still further, the attractive force acting on the table differs among the electromagnets provided on the top and bottom surfaces of the table, which causes the table to deform. As the table moves up and down, the attractive force of each electromagnet changes, which adversely affects the shape of the table. As a result, positioning accuracy is deteriorated.

Finally, when using the electromagnetic devices in an exposure apparatus or measuring instrument using an electron beam, if the electromagnetic devices are positioned on the upper side of the table, then leaking magnetic flux causes the electron beam to bend, disturbing control of the electron beam (e.g., deflection of the beam). Consequently, accurate exposure or measurement cannot be achieved.

SUMMARY OF THE INVENTION

An object of the invention is to provide an exposure apparatus including a supporting stage with a driving apparatus that overcomes the drawbacks noted above in the conventional apparatus and is capable of precisely controlling the position of a driven object in a simple manner.

It is another object of the invention to provide a stage apparatus that can easily control the table position and promptly and accurately register the table.

These and other objects of the invention are achieved by providing an exposure apparatus including a supporting stage with a driving apparatus. The supporting stage movably supports a substrate table, which in turn supports a photosensitive substrate. A magnetic flux driver coupled to the substrate table is disposed between permanent magnets coupled to the supporting stage. The magnet flux driver can be an electromagnetic device or a third permanent magnet. In operation, the magnetic flux driver, which is surrounded by the upper and lower permanent magnets, is configured to effect a repulsive force from the lower magnet and an attractive force from the upper magnet. This concept is extendible to the driving units of the exposure apparatus for controlling a position of the substrate table.

As shown in FIG. 2, the repulsive force (indicated by the solid line) and the attractive force (indicated by the dashed line) have characteristics opposite to each other in relation with the distance. When the repulsive force and the attractive force act simultaneously from opposite sides, the characteristics of the two forces cancel each other, and a substantially constant force is generated regardless of the distance from the stage. Even if the table is driven upward or downward, the weight of the table is supported by a substantially constant force, provided, with respect to an electromagnetic device, that the electric current flowing in the coil element is constant. Consequently, heat generation from the driving unit is suppressed, and undesirable expansion of the table is prevented. As a result, the positioning accuracy of the substrate mounted on the table is improved.

The permanent-magnet may be an ordinary permanent-magnet or a permanent-magnet magnetic circuit. The core of the coil element in the electromagnetic driving unit may be formed of a permanent-magnet. Alternatively, the coil element of the electromagnetic driving unit for Z-direction movement may have a core made of combination of a permanent-magnet and an iron member. The iron used in the core of the coil element reinforces the magnetic force when electric current is supplied to the coil element to make the coil an electromagnet. A greater amount of driving force can be obtained in the electromagnetic driving unit with the same amount of electric current. In other words, electric current for driving the electromagnetic driving unit can be reduced, and heat generation and power consumption can be further suppressed. Of course, other advantages, i.e., supporting the table by a substantially constant resultant force of the repulsive and attractive force, and minimizing the size of the stage apparatus, can also be achieved.

The table can be made movable in directions of six degrees of freedom. In this case, the stage apparatus has six electromagnetic driving units for driving the table in six directions with six degrees of freedom, including the gravity direction. Because the table is movable in six degrees of freedom in a non-contacting manner, hysterisis or dead zone due to friction does not exist.

The stage may be mounted on a sub-stage which is movable within a horizontal plane. In this case, the stage apparatus of the invention can serve as a fine adjustment stage, and the horizontal sub-stage can be used as a rough adjustment stage, the fine adjustment stage being precisely controlled.

BRIEF DESCRIPTION OF THE DRAWINGS

These and other aspects and advantages of the present invention will be described in detail with reference to the accompanying drawings, in which.

DETAILED DESCRIPTION OF PREFERRED EMBODIMENTS

An embodiment of the invention will be described with reference to FIGS. 4–11.

Figure 4:
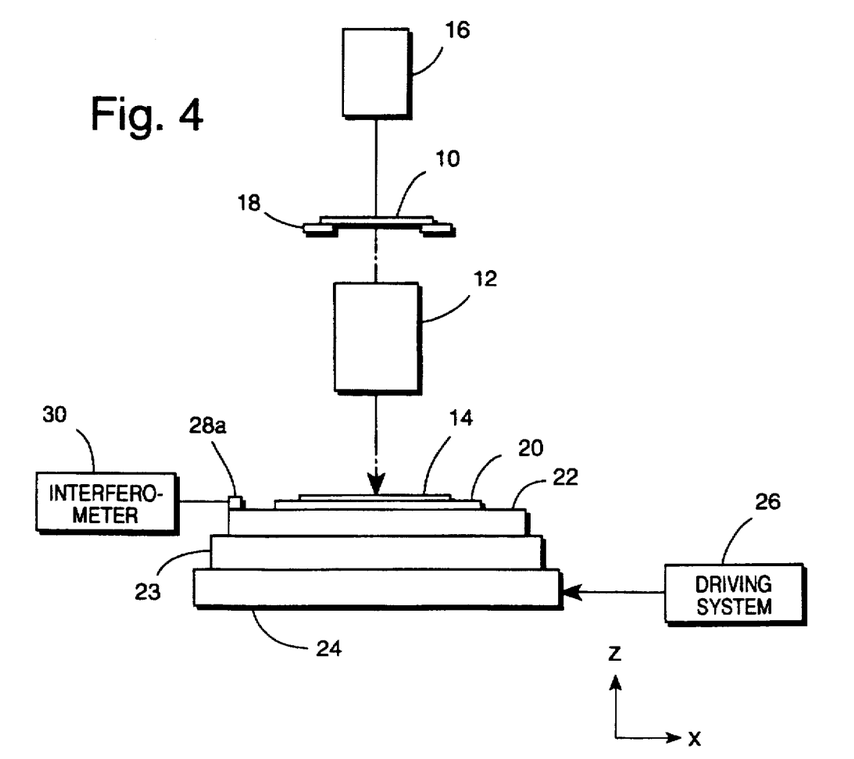
FIG. 4 is a schematic diagram of the projection exposure apparatus according to an embodiment of the invention.

FIG. 4 illustrates the structure of the projection exposure apparatus according to an embodiment of the present invention. The pattern (not shown) formed on a reticle 10 is transferred onto a wafer 14 through a projection optical system 12 and formed as a projected image. The light emitted from an illumination system 16 illuminates a reticle 10 held by a reticle holder 18 with uniform illuminance. The light beam having passed through the reticle 10 is guided by the projection optical system 12 to the wafer 14 mounted on a wafer table 20. The wafer table 20 is mounted on a Z-leveling stage 22, which is moved in the vertical direction (Z direction) by a driving system 26. The Z-leveling stage 22 is mounted on an X-axis driving stage 23, which is moved in the X direction through the driving system 26. The X-axis driving stage 23 is further mounted on a Y-axis driving stage 24, which is moved in the Y direction through the driving system 26. Moving mirrors 28a, 28b (FIG. 5) are fixed to the Z-leveling stage 22 for position measurement. The light beams reflected from the moving mirrors 28a, 28b are detected by interferometers 30 (one shown) to monitor the two-dimensional position (XY coordinates) of the Z-leveling stage 22.

With this structure, the wafer 14 is driven in the X and Y directions by the X-axis driving stage 23 and the Y-axis driving stage, respectively, while the position of the wafer 14 is monitored with the interferometers 30, thereby successively exposing the pattern of the reticle 10 in a step-and-repeat manner. If, prior to exposure, the pattern image of the reticle 10 is not correctly formed on the wafer 14 (i.e., in a defocusing state), or if the wafer 14 is not precisely leveled, then the Z-leveling stage 22 is driven to adjust the Z-axis position of the wafer 14 and level the surface of the wafer 14.

Figure 5:
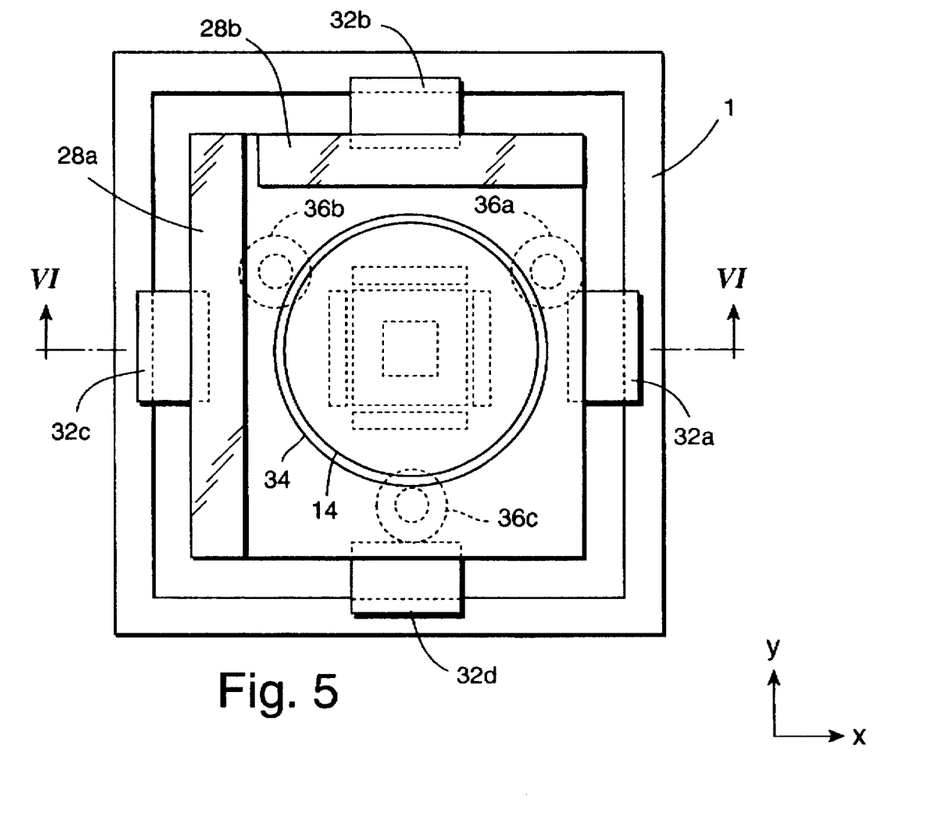
FIG. 5 is a plan view of the stage according to an embodiment of the invention.
Figure 6:
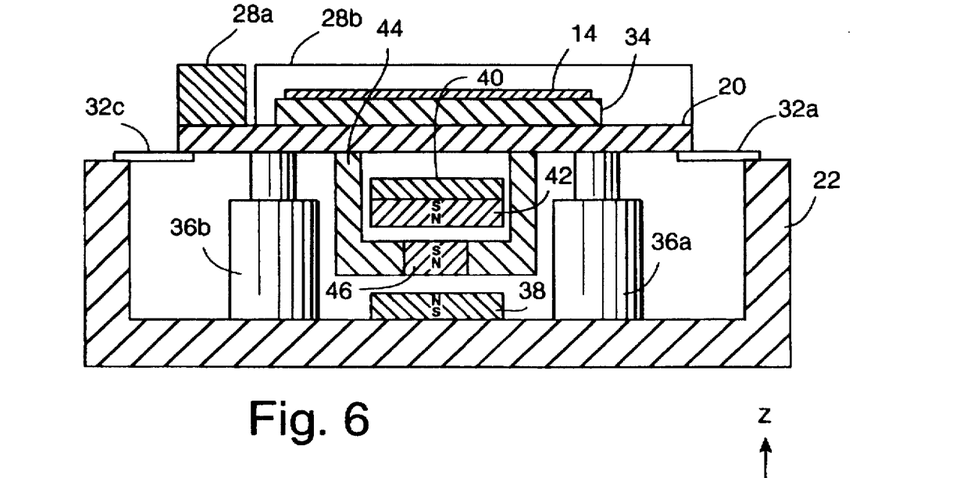
FIG. 6 is a cross-sectional view of the stage taken along line VI—VI of FIG. 5.

FIGS. 5 and 6 show the structure of the Z-leveling stage 22. The wafer table 20 is supported on the Z-leveling stage 22 via flexible leaf springs 32a, 32b, 32c, 32d which can bend in the Z direction. The flexible leaf springs allow the wafer table 20 to move in three directions relative to the Z-leveling stage 22, namely, the Z direction and two rotational directions (Xθ and Yθ directions) about the X and Y axes, respectively. The wafer 14 is fixed to a wafer holder 34 through known vacuum adsorption. The wafer holder 34 is then mounted on the wafer table 20. The Z-leveling stage 22 is made hollow so that voice coil motors 36a, 36b, 36c are accommodated within the Z-leveling stage 22 to drive the wafer table 20 in the Z direction. Capacitance sensors (not shown) measure the displacement of the wafer table 20 in the Z direction with respect to the Z-leveling stage 22 at three points. The measurement result is used to adjust the position of the wafer table 20 in the Z, Xθ, and Yθ directions.

Figure 7:
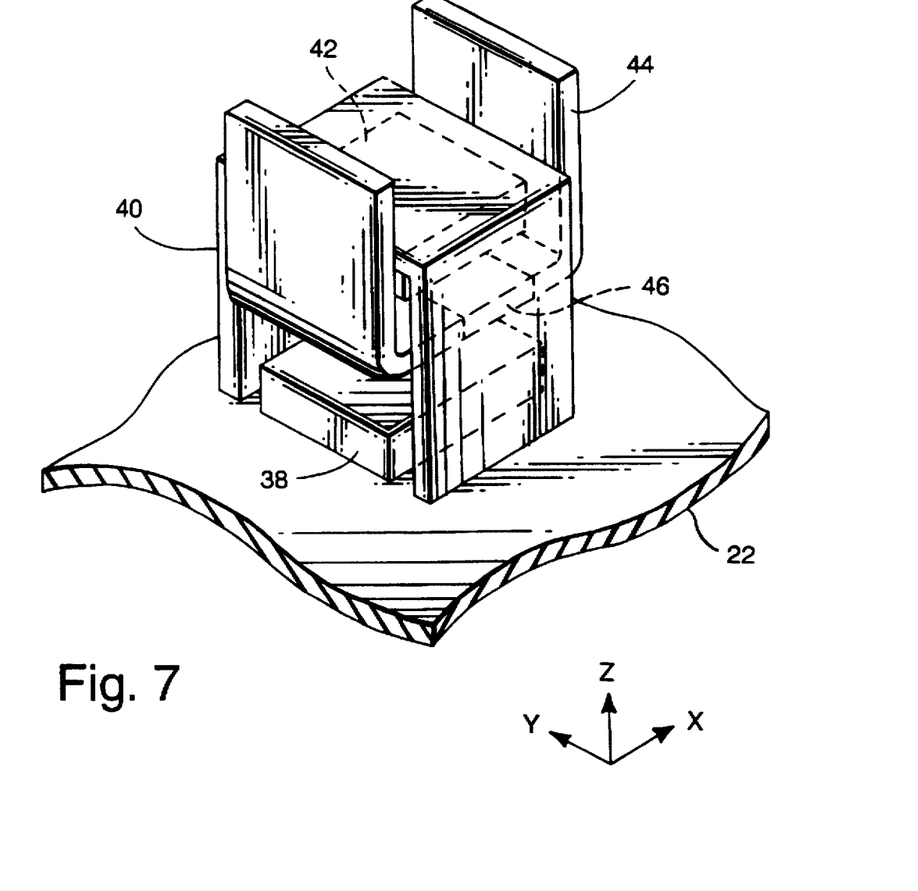
FIG. 7 is a perspective view showing the driving structure of the invention.

A table supporting mechanism (38, 40, 42, 44, 46) for supporting the weight of the wafer table 20 is provided directly below the wafer table 20. As shown in FIGS. 6 and 7, the table supporting mechanism includes a permanent-magnet 38 fixed to the Z-leveling stage 22, an inverse U-shaped holder 40 fixed to the Z-leveling stage 22, a permanent-magnet 42 fixed inside the top of the inverse U-shaped holder 40, a U-shaped holder 44 meshed with the inverse U-shaped holder 40 and fixed to the wafer table 20, and a permanent-magnet 46 embedded in the bottom of the U-shaped holder 44. The permanent-magnet 38 is a rectangular solid and is positioned with the N pole facing toward the wafer table 20. The permanent-magnet 42 has substantially the same dimension as and is approximately vertically aligned with the permanent-magnet 38 and is positioned with the N pole facing toward the N pole of the permanent-magnet 38. The permanent-magnet 46 is positioned so that the N pole is facing the N pole of the permanent-magnet 38 and the S pole is facing the N pole of the permanent-magnet 42. The distances between the permanent-magnets 38 and 46, and between the permanent-magnets 46 and 42 are set in accordance with the magnitude of the magnetic force of each permanent-magnet, the weight of the wafer table 20, and other factors Since, in the table supporting mechanism (38, 40, 42, 44, 46), the N pole of the permanent-magnet 38 and the N pole of the permanent-magnet 46 are disposed facing each other, a repulsive magnetic field acts between the bottom permanent-magnet 38 and the middle permanent-magnet 46. This repulsive force lifts the wafer table 20 upward. In opposite relation, the N pole of the upper permanent-magnet 42 and the S pole of the middle permanent-magnet 46 are disposed facing each other, and an attractive magnetic field acts between the upper permanent magnet 42 and the middle permanent magnet 46 to also lift the wafer table 20 upward. With this arrangement, a substantially constant force can be generated as the resultant of the attractive and repulsive forces, in which the spring constant of the repulsive field and the spring constant of the attractive field cancel each other. The magnitude of the resultant force can be controlled by adjusting the magnitude of the magnetic force of the permanent-magnets 38, 42, 46, and the distances between the permanent-magnets, so as to balance the weight of the wafer table.

Figure 8:
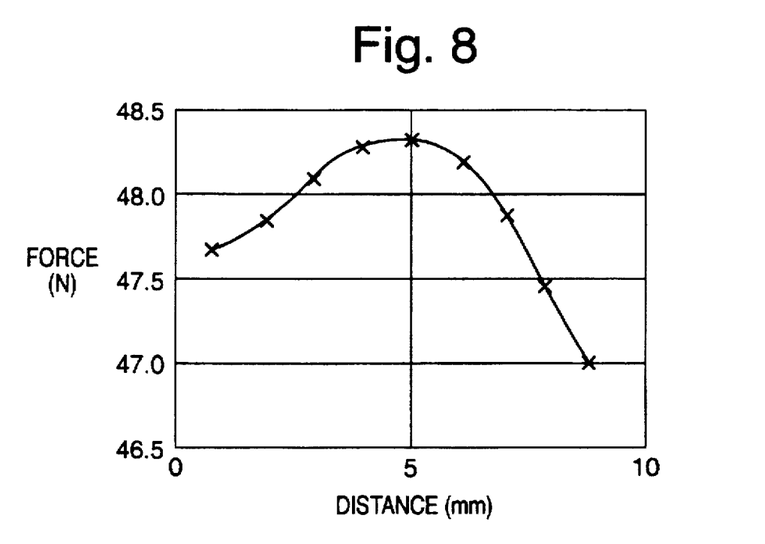
FIG. 8 is a graph plotting the magnetic force as a function of distance.
Figure 9:
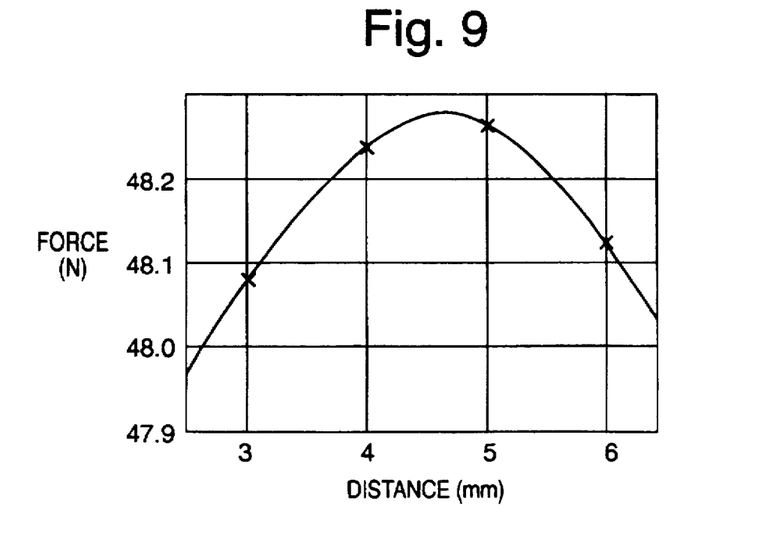
FIG. 9 is a part of the graph of FIG. 8 showing more detailed values.
Figure 10:
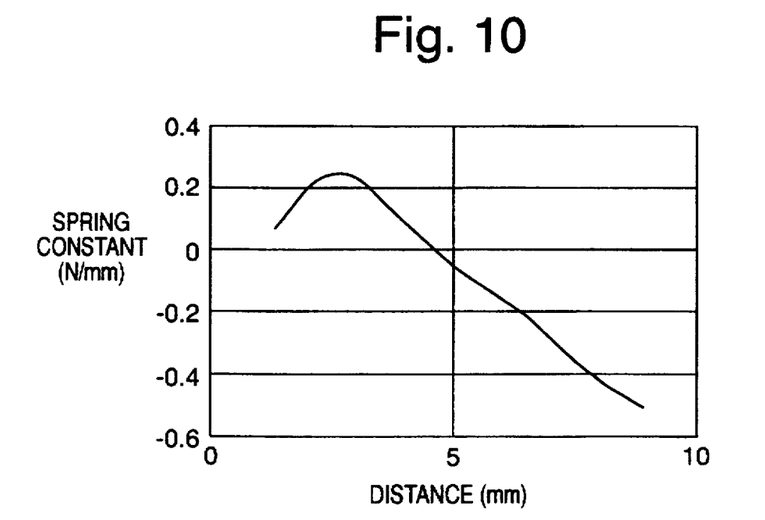
FIG. 10 is a graph plotting the spring constant as a function of distance.
Figure 11:
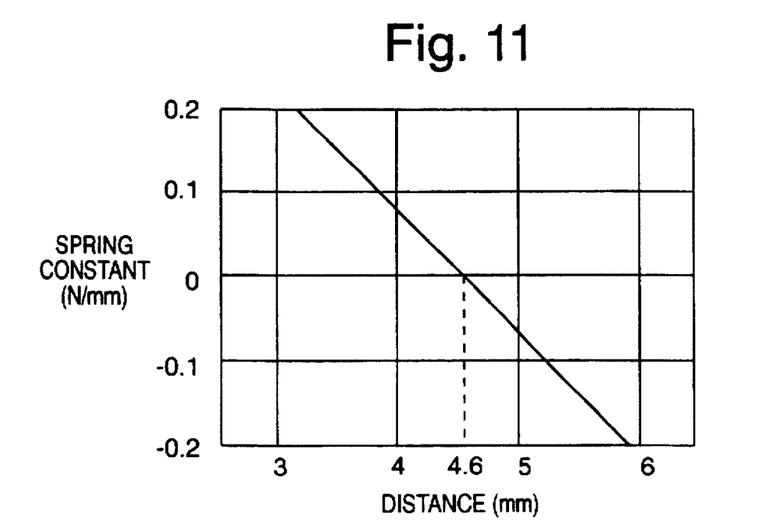
FIG. 11 is a part of the graph of FIG. 10 showing more detailed values.

FIGS. 8 and 9 show the relationship between the upward force acting on the middle permanent-magnet 46 relative to the distance from the lower permanent-magnet 38. FIG. 9 enlarges a part of FIG. 8. Even if the distance between the permanent-magnets 38 and 46 changes, the upward force acting on the middle permanent-magnet 46 does not change significantly (with the error within about 1N). FIGS. 10 and 11 show the relationship between the spring constant relative to the distance between the permanent-magnets 38 and 46. FIG. 11 enlarges a part of FIG. 10. As shown in FIG. 11, the spring constant becomes zero when the distance between the permanent-magnets 38 and 46 is 4.6 mm. In the vicinity of this point, the spring constant is very small with little change. This can also be understood from FIG. 2 plotting the repulsive force (solid line) and the attractive force (dashed line) as a function of the distance. The characteristics of the attractive and repulsive forces are opposite to each other. Consequently, when the repulsive forces and the attractive force are applied simultaneously to the middle magnet, the opposite force characteristics cancel each other, and a substantially constant force acts on the magnet regardless of the distance between the magnets.

To adjust the wafer table 20 in the Z, Xθ, and Yθ directions, voice coil motors 36a, 36b, 36c are driven by the driving system 26 depending on the necessary adjustment amount. Since the weight of the wafer table 20 is supported by a substantially constant force regardless of the distance, the voice coil motors 36a, 36b, 36c do not have to generate extra force to correct the change in the magnetic force, unlike the conventional technique. Accordingly, heat generation due to excessive driving of the voice coil motors is prevented. Furthermore, because the weight of the wafer table 20 is supported in a non-contacting manner, hysterisis or dead zone due to friction does not occur, thereby achieving highly precise registration.

Figure 12:
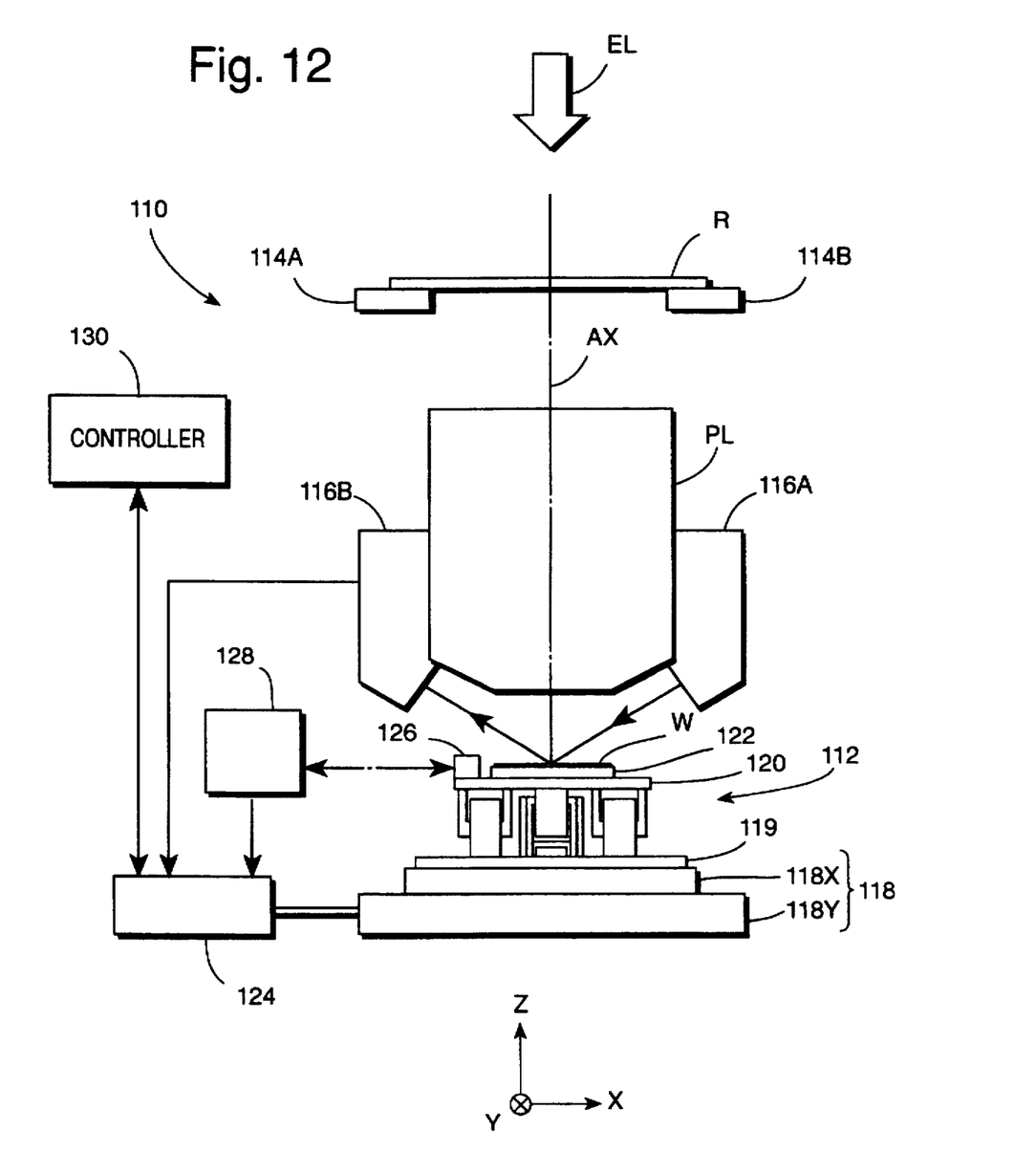
FIG. 12 is a schematic diagram of an exposure apparatus to which the stage apparatus of an alternative embodiment is applied.

An alternative embodiment of the invention will be described with reference to FIGS. 12–17. FIG. 12 illustrates a projection exposure apparatus 110 in which the stage and driving apparatus of this embodiment are used.

The projection exposure apparatus 110 has a stage apparatus 112, which microscopically drives a wafer W as a photosensitive substrate in six degrees of freedom, namely, in the X, Y, and Z directions, and rotational directions about the X, Y, and Z axes (Xθ, Yθ and Zθ). The stage apparatus 112 is mounted on an XY rough-adjustment stage 118, which moves within an XY two-dimensional plane. A projection lens PL is positioned above the stage apparatus 112 so that the optical axis AX of the projection lens PL coincides with the Z axis. Reticle holders 114A and 114B hold the reticle R in a plane perpendicular to the optical axis AX above the projection lens PL. In FIG. 12, the horizontal direction across the paper is the X-axis direction, the direction perpendicular to the paper is the Y-axis direction, and the vertical direction is the Z-axis direction.

The XY rough-adjustment stage 118 is composed of a Y-stage 118Y, which moves in the Y direction on the surface plate (not shown), and an X-stage 118X, which moves in the X direction on the Y-stage 118Y. The Y-stage 118Y and X-stage 118X have a relatively long moving stroke so that they can move on the surface plate freely.

The stage apparatus 112 is mounted on the Y-stage 118Y and includes a sample table 120. The sample table 120 is microscopically driven in directions of six degrees of freedom, namely, in the X, Y, Z, Xθ, Yθ and Zθ directions. A wafer holder 122 is mounted on the sample table 120, and a wafer W coated with photoresist is fixed to the wafer holder 122 through a vacuum chuck (not shown).

The reticle holders 114A, 114B are slightly driven within the XY two-dimensional plane so that the center of the reticle pattern (reticle center) is aligned with the optical axis AX.

When the reticle R is illuminated by an illumination light EL (which is indicated by the arrow in FIG. 12), the pattern formed on the reticle R is exposed and projected through the projection lens PL onto the wafer W. In order to correctly form a pattern image on the surface of the wafer W, the exposure field of the wafer W must coincide with the image-forming plane of the projection lens PL (i.e., the image plane of the projected pattern). To this end, a light-transmitting unit 116A and a light-receiving unit 116B are provided on both sides of the projection lens PL to detect the Z position of the wafer surface (i.e., defocusing amount) and the inclination of the wafer W with respect to the XY plane. The light-emitting unit 116A and light-receiving unit 116B constitute a so-called multipoint AF focus-leveling sensor using oblique incident light.

Prior to exposing the reticle pattern, a stage controller 124, communicating with a main controller 130, monitors the output signal from the light-receiving unit 116B to determine if the wafer surface in the exposure field is coincident with the image plane of the projected pattern. If the wafer surface is not coincident with the image plane, then the three electromagnetic driving units of the stage apparatus 112, which are used for Z-direction (gravity direction) adjustment, are controlled to adjust the Z displacement and the inclination of the sample table 120 until the wafer surface in the exposure field is coincident with the image plane.

Moving mirrors 126 are provided on the sample table 120. The positions of the moving mirrors 126 are measured by laser interferometers 128. Although FIG. 12 illustrates only a single moving mirror 126 and a laser interferometer 128 representatively, an X moving mirror 126X and a Y moving mirror 126Y are positioned on the sample table 120. The position of the X moving mirror 126X is detected by an X laser interferometer, while the position of the Y moving mirror 126Y is detected by two Y laser interferometers. Thus, the laser interferometers 128 measure the position (X, Y and Zθ) of the sample table 120 (or wafer W) in the two-dimensional plane. The measuring result is input to a stage controller 124. The stage controller 124 drives the X stage 118X and Y stage 118Y through the X driving motor and Y driving motor (not shown), while monitoring the measured result from the laser interferometers 128. The stage apparatus 112 is mounted on the XY rough-adjustment stage 118. When moving the wafer W in a stepwise manner during exposure, the wafer W is roughly positioned by the XY rough-adjustment stage 118 based on the output from the laser interferometers 128 and finely adjusted (in the X Y and Zθ directions) by the horizontal electromagnetic driving units of the stage apparatus 112. The stage controller 124 controls the three electromagnetic driving units of the stage apparatus 112, as well as the stage driving operation, including focusing and leveling, and the exposure operation.

Figure 13:
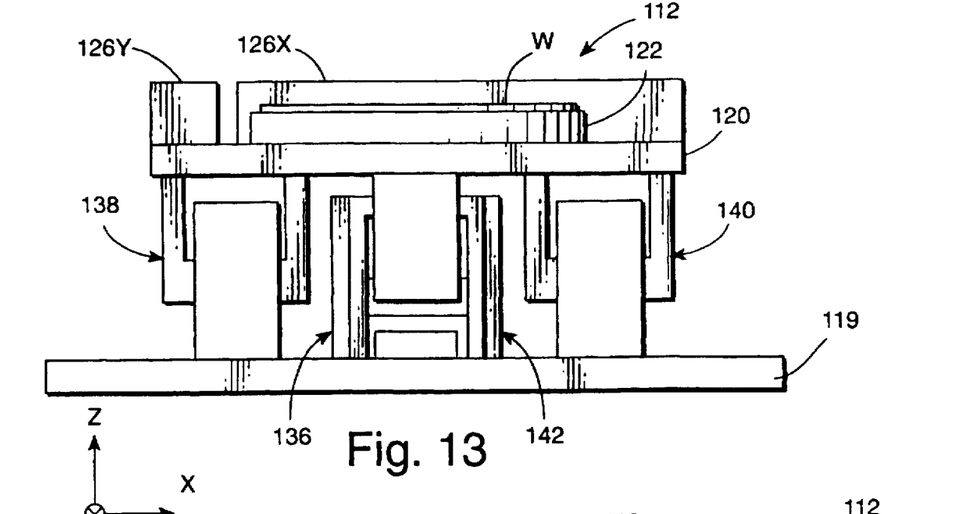
FIG. 13 is a front view of the stage apparatus of FIG. 12.
Figure 14:
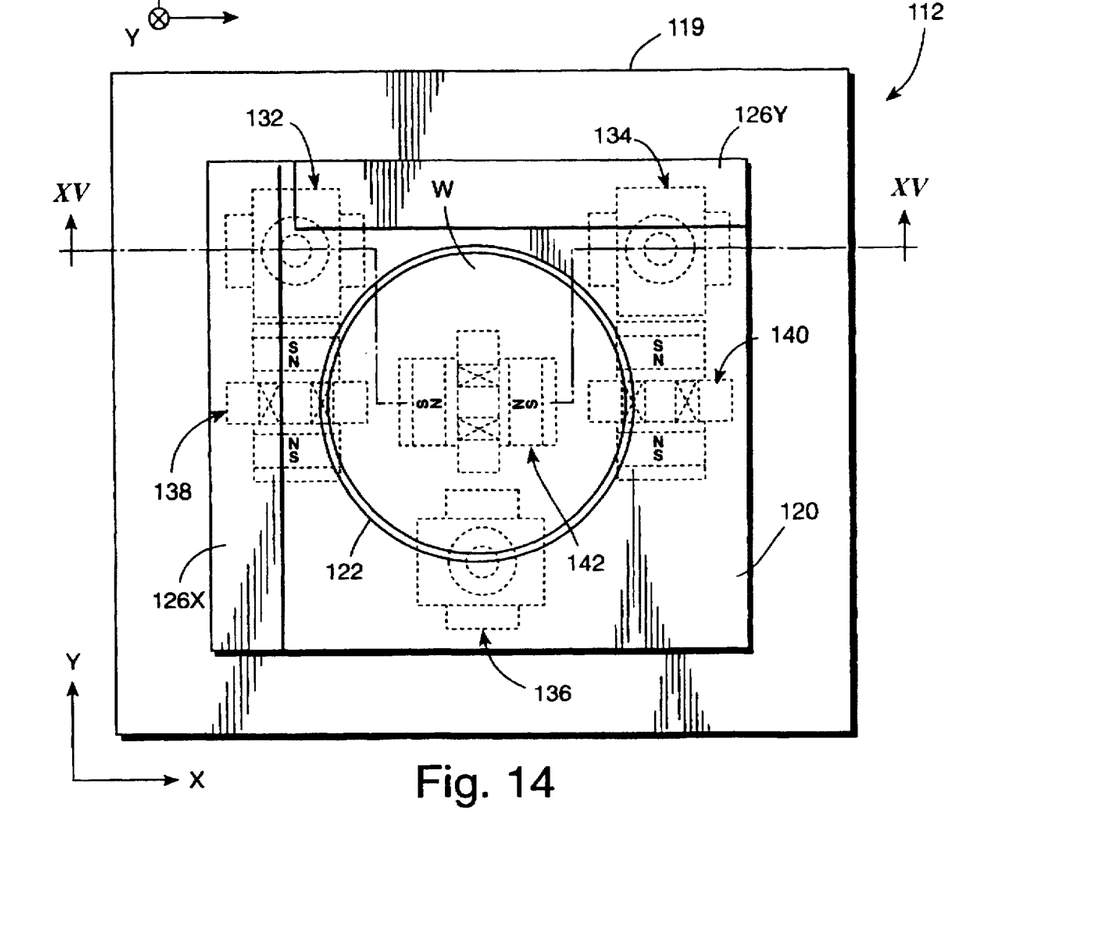
FIG. 14 is a plan view of the stage apparatus of FIG. 13.
Figure 15:
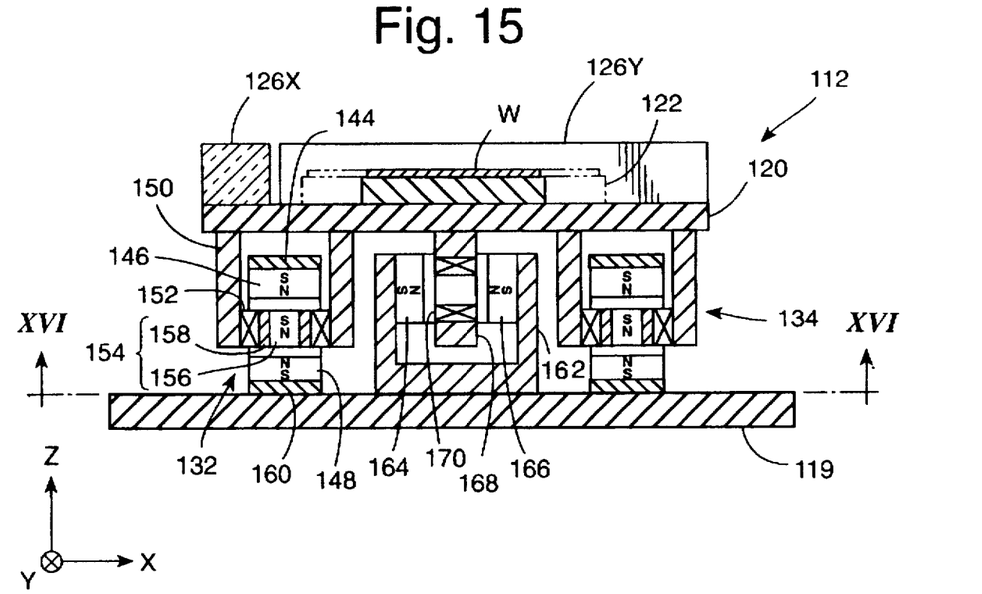
FIG. 15 is a cross-sectional view of the stage apparatus taken along line XV—XV in FIG. 14.
Figure 16:
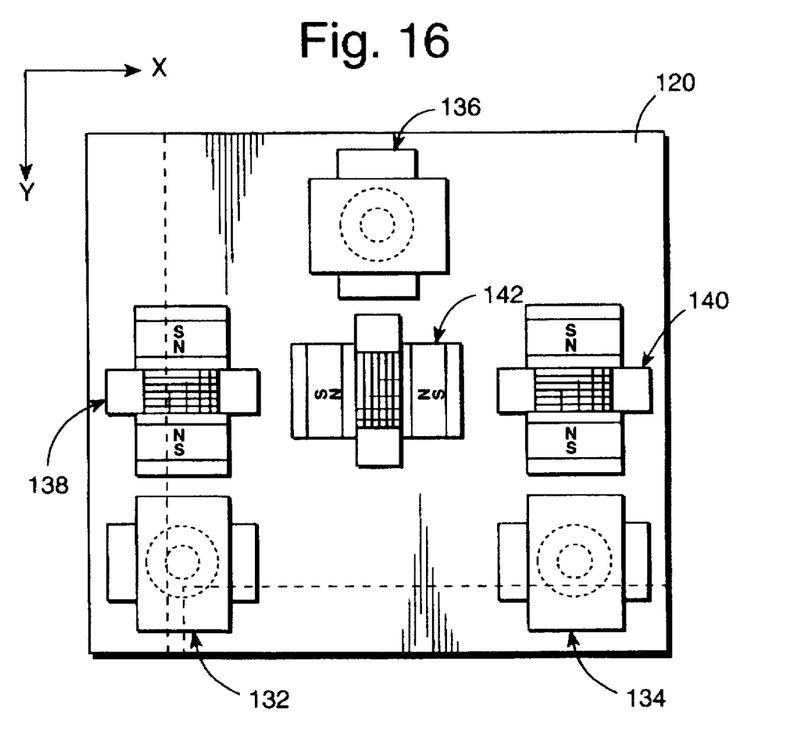
FIG. 16 is a horizontal cross-sectional view of the stage apparatus taken along line XVI—XVI in FIG. 15.

FIGS. 13–16 show the detailed structure of the stage apparatus 112 of FIG. 12. FIG. 13 is a front view, FIG. 14 is a plan view, FIG. 15 is a cross-sectional view taken along line XV—XV of FIG. 14, and FIG. 16 is a horizontal cross-section taken along line XVI—XVI of FIG. 15.

The stage apparatus 112 includes a stage 119 and a sample table 120 positioned on the stage 119. Three electromagnetic driving units 132, 134, 136 support the sample table 120 at three different points and drive the sample table 120 in the Z (vertical) direction. Three additional electromagnetic driving units 138, 140, 142 drive the sample table 120 in the horizontal direction within a two-dimensional plane.

The three electromagnetic driving units 132, 134, 136 for Z-direction movement are positioned under the sample table 120 so as to define a substantially equilateral triangle (FIG. 14). The electromagnetic driving units 132, 134, 136 are independently driven to move the sample table 120 in the Z, Xθ, and Yθ directions. The driving amount of each electromagnetic driving unit is controlled to adjust the vertical position and the inclination (rolling amount and pitching amount) of the sample table 120.

Among the three horizontal electromagnetic driving units 138, 140 and 142, the electromagnetic driving units 138 and 140 are used to drive the sample table 120 in the Y direction relative to the stage 119 and are positioned substantially symmetrical with respect to the center of the sample table 120 along the X axis. If the magnitudes and the directions of the driving amounts of the electromagnetic driving units 138 and 140 are equal, the sample table 120 is moved in the Y direction. If the directions of the electromagnetic driving units 138 and 140 are opposite (+Y direction and -Y direction), then the sample table 120 is rotated about the Z axis within a predetermined range. The rotational (Zθ) position of the sample table 120 is adjusted by controlling the driving amounts of the electromagnetic driving units 138, 140. The electromagnetic driving unit 142 is used to move the sample table 120 along the X axis relative to the stage 119, and positioned substantially in the center of the sample table 120.

The structure of the Z-direction electromagnetic driving units will be explained exemplifying electromagnetic driving unit 132. As shown in FIG. 15, the electromagnetic driving unit 132 has a magnet holder 144 fixed to the stage 119 and having an inverse U-shaped cross-section. A pair of permanent-magnets 146, 148 are held by the magnet holder 144 with a predetermined distance therebetween in the Z direction. The electromagnetic driving unit 132 also has a U-shaped coil holder 150 fixed to bottom surface of the sample table 120. The coil holder 150 holds a coil element 152 positioned between the permanent-magnets 146 and 148. The coil element 152 has a core 154 preferably composed of a permanent-magnet 156 and an iron core 158 such that the magnetic flux becomes parallel to the magnetic flux of the permanent-magnets 146, 148. The combination of the iron core 158 and the permanent-magnet 156 can reinforce the magnetic driving force, as compared with the case in which a hollow or nonmagnetic core is used, or in which only a permanent-magnet is used.

The permanent-magnet 146 is fixed to the inner surface of the top of the magnet holder 144 with the N pole facing downward. The other permanent-magnet 148 is mounted on the stage 119, through the spacer 160, with the N pole facing upward. The spacer 160 is used to adjust the distance between the two permanent-magnets. The coil element 152 is wound around the core 154 so that the direction of the magnetic flux aligns with the Z direction. The core 154 comprises a cylindrical iron core 158 and a permanent-magnet 156 inserted into the iron core 158 with the S pole facing the permanent-magnet 146 and the N pole facing the permanent-magnet 148. The electromagnetic driving units 134 and 136 have the same structure.

If no electric current is supplied to the coil element 152 of the electromagnetic driving unit 132, an attractive force is generated between the permanent-magnet 146 and the coil magnet 156, while a repulsive force is generated between the permanent-magnet 148 and the coil magnet 156. The electromagnetic driving units 132, 134, 136 support the weight of sample table 120 through the resultant of the attractive force and the repulsive force. The supporting force applied to the sample table 120 can be controlled by adjusting the magnitude of the permanent-magnets or by adjusting the distance between the pair of permanent-magnets (for example, by adjusting the thickness of the spacer 160). Thus, the weight of the sample table 120 is supported by a magnetic force that is generated by the permanent-magnets in the three electromagnetic driving units 132, 134, 136.

The attractive force between the permanent-magnet 146 and the coil magnet 156 and the repulsive force between the permanent-magnet 148 and the coil magnet 156 change nonlinearly as a function of the distance (in inverse proportion to the square of the distance). Suppose the distance between the permanent-magnet 146 and the coil magnet 156 is L1 and the distance between the permanent-magnet 148 and the coil magnet 156 is L2, then L1+L2=L (where L is a constant defined by the distance between the pair of permanent-magnets 146 and 148 held by the magnet holder 144). As shown in FIG. 2, the attractive force between the permanent-magnet 146 and the coil magnet 156 (solid line) and the repulsive force between the permanent-magnet 148 and the coil magnet 156 (broken line) indicate opposite characteristics to each other in relation to the distances L1 and L2, respectively. When the repulsive force and the attractive force act on the coil magnet 156 simultaneously, the nonlinear characteristics are mutually canceled, and a substantially constant force is generated regardless of the position of the coil magnet 156 relative to the permanent-magnet 148. This applies equally to the other electromagnetic driving units 134 and 136. The weight of the table can be supported by the magnetic force that is naturally generated by the permanent-magnets of the electromagnetic driving units 132, 134, 136 without supplying electric current to the coil element 152. Accordingly, heat generation from the electromagnetic driving units can be suppressed. The upward magnetic force (i.e., the resultant of the attractive and repulsive forces) for supporting the table 120 is substantially constant regardless of the position of the coil element 152.

Figure 17:
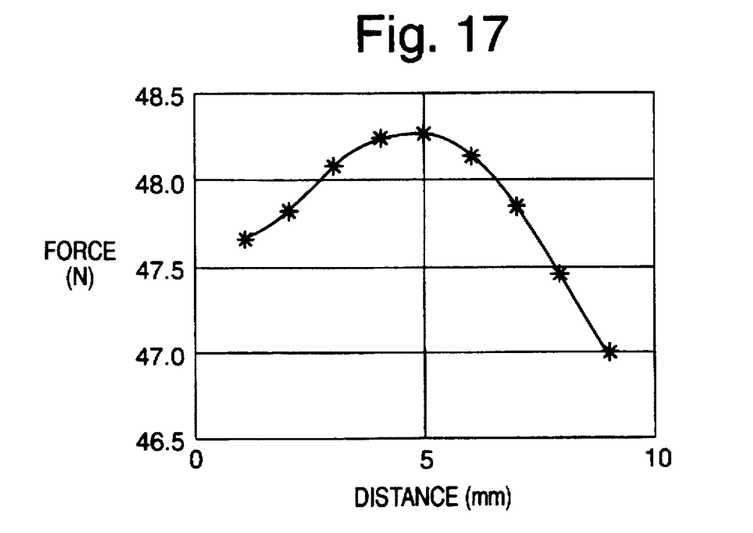
FIG. 17 is a graph plotting the resultant of the repulsive force and the attractive force simultaneously acting on the movable permanent-magnet, which is substantially constant regardless of the position of the sample table.

FIG. 17 shows that the upward magnetic force generated by the electromagnetic driving units 132, 134, 136 is substantially constant with only small changes over varying distances. In FIG. 17, the horizontal axis represents the distance L2 between the permanent-magnet 148 and the coil magnet 156, and the vertical axis represents the upward force. Of course, as distance L2 increases, distance L1 decreases correspondingly. It becomes apparent from FIG. 17 that the upward force changes very little near 4.6 mm.

If electric current is supplied to the coil element 152 of the electromagnetic driving unit 132 to generate magnetic flux with the S pole up and the N pole down, an attractive force is generated between the upper permanent-magnet 146 and the coil magnet 156, and a repulsive force is generated between the lower permanent-magnet 148 and the coil magnet 156. As a result, the electromagnetic driving unit 132 generates an upward force and drives the sample table 120 upward along the Z axis.

If the direction of electric current flowing in the coil element 152 is inverted, magnetic flux is generated with the N pole up and the S pole down. A repulsive force is generated between the upper permanent-magnet 146 and the coil magnet 156, and an attractive force is generated between the lower permanent-magnet 148 and the coil magnet 156. The resultant of the two forces is downward, and the electromagnetic driving unit 132 moves the sample table 120 downward along the Z axis.

Because the repulsive force and the attractive force have opposite characteristics, as indicated by the solid line and broken line in FIG. 2, the nonlinear characteristics are canceled out when the two forces are applied simultaneously, thereby generating a driving force that is substantially linear with respect to the electric current flowing in the coil element 152, regardless of the position of the sample stage 120. The electromagnetic driving units 134 and 136 also generate a driving force in the Z direction with good linearity regardless of the vertical position of the sample table 120 by controlling the electric current supplied to the coil element 152 of the electromagnetic driving units 132, 134, 136. Consequently, the sample table 120 is easily and reliably positioned in the Z and tilting directions (through focusing control and leveling control).

With continued reference to FIG. 15, the electromagnetic driving unit 142 for movement in the X direction includes a U-shaped magnet holder 162 fixed to the top surface of the stage 119. A pair of permanent-magnets 164, 166 are held by the magnet holder 162 so as to be aligned in the X direction with a predetermined distance therebetween. The N poles of the permanent-magnets 164 and 166 are disposed facing each other. The horizontal electromagnetic driving unit 142 also includes a coil holder 168 attached to the bottom surface of the sample table 120. The coil holder 168 holds a coil element 170 between the permanent-magnets 164 and 166. The coil element 170 generates magnetic flux in the X direction.

When electric current is supplied to the coil element 170, an attractive force is generated between the coil element 170 and one of the permanent magnets 164, 166, while a repulsive force is generated between the coil element 170 and the other of the permanent-magnets, depending on the direction of the electric current. This force becomes the driving force for moving the sample table 120 back and forth along the X axis. The driving force has good linearity with respect to the level of the electric current flowing in the coil element 170. The other horizontal electromagnetic driving units 138 and 149 have the same structure, and generate a driving force in the Y direction.

By controlling the magnitude and direction of the electric current supplied to the coil elements of the electromagnetic driving units 138, 140, 142, the position of the sample table 120 can be precisely adjusted within the XY plane and quickly and accurately registered.

With the structure according to the present invention, the electromagnetic driving units are positioned only under the sample table, without using the top surface of the sample table, unlike the conventional structure. As a result, the apparatus can be made smaller, and the detrimental effect of leaking magnetic flux to an electron beam can be reduced. Thus, the present invention is suitable to an exposure apparatus or measuring apparatus using electron beams. Because a driving force is applied to the sample table from one side (e.g., from the bottom), deformation of the sample table is prevented.

The exposure apparatus 110 using the stage apparatus 112 as a wafer stage is capable of positioning the wafer W quickly and precisely with six degrees of freedom. This structure can achieve highly accurate alignment during exposure and improve the throughput of the apparatus. Because the sample table 120 moves with six degrees of freedom, it is not necessary to provide a Z-leveling table and a θ table separately. The structure of the apparatus is thus simplified.

The coil element 170 of the horizontal electromagnetic driving units 138, 140, 141 has a hollow core in the embodiment; however, the core may be constructed by nonmagnetic material, such as resin, magnetic material, such as iron, magnet, or a combination of magnet and iron. Although, in the embodiment, the coil element 152 of the Z-direction electromagnetic driving units 132, 134, 136 has a core made of a combination of a permanent-magnet and iron, it may also be made of only a permanent-magnet. The same effect can be obtained by such a modification. That is, the weight of the table is supported by the resultant of the attractive force and repulsive force generated between the permanent-magnet of the core element and a pair of permanent magnets. This structure does not require any extra devices or an electric current supply for supporting the table. The resultant force is substantially constant regardless of the vertical position of the table. Thus, the apparatus can be made small, while preventing heat generation from the electromagnetic driving unit.

FIGS. 4 and 12 show an application in which the present invention is applied to a step-and-repeat type exposure apparatus. However, the driving apparatus and stage apparatus of the invention can be applied to a step-and-scan type exposure apparatus disclosed in, for example, Japanese Laid-open patent application Nos. 4-196513, 4-277612 and 2-229423, in which a reticle and a wafer are synchronously moved during exposure. This invention is suitable to any apparatus that require highly precise positioning of a sample table.

While the invention has been described in connection with what is presently considered to be the most practical and preferred embodiments, it is to be understood that the invention is not to be limited to the disclosed embodiments, but on the contrary, is intended to cover various modifications and equivalent arrangements included within the spirit and scope of the appended claims.

What is claimed is:

1. A driving apparatus for controlling a position of an object by driving a second member relative to a first member using a magnetic force, the driving apparatus comprising:
   a first magnet and a second magnet spaced from said first magnet, coupled to one of said first member and said second member,
   a magnetic flux driver coupled to the other of said first member and said second member and disposed between said first magnet and said second magnet said magnetic flux driver generating a magnetic flux having opposite poles at opposite sides of said magnetic flux driver, and
   a driver holder coupled to said magnetic flux driver, said driver holder being substantially U-shaped.

2. A driving apparatus for controlling a position of an object by driving a second member relative to a first member using a magnetic force, the driving apparatus comprising:
   a first magnet and a second magnet spaced from said first magnet coupled to one of said first member and said second member,
   a magnetic flux driver coupled to the other of said first member and said second member, and disposed between said first magnet and said second magnet, wherein said magnetic flux driver comprises a coil element which generates a magnetic flux having opposite poles at opposite sides of said magnetic flux driver.

3. A supporting structure according to claim 2, wherein said coil element comprises a core made of a permanent-magnet.

4. A supporting structure according to claim 2, wherein said coil element comprises a core made of a combination of a permanent-magnet and an iron member.

5. An exposure apparatus for transferring an image of a pattern formed on a mask onto a photosensitive substrate mounted on a substrate table, the exposure apparatus comprising:
   a reticle holder supporting a reticle having the pattern formed thereon;
   an illumination system for illuminating the reticle;
   a projection optical system that guides a light beam from the illumination system to the photosensitive substrate;
   a focus-leveling sensor that detects a position of the surface of said substrate, and
   a supporting structure movably supporting said substrate table, the supporting structure including:
   a stage,
   a first magnet and a second magnet spaced from said first magnet, coupled to one of said table and said stage,
   a magnetic flux driver coupled to the other of said table and said stage and disposed between said first magnet and said second magnet, said magnetic flux driver generating a magnetic flux having opposite poles at opposite sides of said magnetic flux driver in accordance with said position detected with said focus-leveling sensor.

6. An exposure apparatus according to claim 5, wherein said magnetic flux driver comprises a third magnet coupled to the substrate table.

7. An exposure apparatus according to claim 5, wherein said magnetic flux driver comprises a coil element.

8. An exposure apparatus according to claim 7, wherein said coil element comprises a core made of a permanent-magnet.

9. An exposure apparatus according to claim 7, wherein said coil element comprises a core made of a combination of a permanent-magnet and an iron member.

10. An exposure apparatus according to claim 5, further comprising a sub-stage movable in a substantially horizontal plane, said stage being mounted on said sub-stage.

11. An exposure apparatus according to claim 5, further comprising a driving unit coupled between the substrate table and said stage, said driving unit driving the substrate table in at least one direction.

12. An exposure apparatus according to claim 11, wherein said driving unit comprises a voice coil motor.

13. An exposure apparatus according to claim 11, comprising a plurality of driving units that drive the table in at least three directions corresponding to at least Z, θ and Yθ.

14. An exposure apparatus according to claim 13, comprising six driving units that drive the table in directions of six degrees of freedom.

15. An exposure apparatus according to claim 11, wherein said driving unit comprises an electromagnetic driving unit.

16. An exposure apparatus according to claim 11, wherein said driving unit comprises:

a pair of permanent-magnets coupled to said stage; and a driving unit magnetic flux driver coupled to the substrate table and disposed between said pair of permanent magnets, said driving unit magnetic flux driver generating a magnetic flux having opposite poles at opposite sides of said driving unit magnetic flux driver, wherein same poles of one of said pair of s permanent-magnets and said driving unit magnetic flux driver are disposed facing each other, and opposite poles of the other of said pair of permanent-magnets and said driving unit magnetic flux driver are disposed facing each other.

17. An exposure apparatus according to claim 16, wherein said driving unit magnetic flux driver comprises another permanent-magnet coupled to the substrate table.

18. An exposure apparatus according to claim 16, wherein said driving unit magnetic flux driver comprises a coil element.

19. An exposure apparatus according to claim 18, wherein said coil element comprises a core made of a permanent-magnet.

20. An exposure apparatus according to claim 18, wherein said coil element comprises a core made of a combination of a permanent-magnet and an iron member.

21. A driving apparatus for controlling a position of an object by driving a second member relative to a first member using a magnetic force, the driving apparatus comprising:

three pairs of permanent-magnets coupled to one of said first member and said second member; and three magnetic flux drivers coupled to the other of said first member and said second member and disposed between said pairs of permanent magnets, respectively said three magnetic flux drivers generating a magnetic flux having opposite poles at opposite sides of said magnetic flux drivers and driving said second member in at least three directions corresponding to at least Z, Xθ, and Yθ.

22. A driving apparatus according to claim 21, wherein said magnetic flux drivers comprise another permanent-magnet coupled to the second member.

23. A driving apparatus according to claim 21, wherein said magnetic flux drivers comprise a coil element.

24. A driving apparatus according to claim 23, wherein said coil element comprises a core made of a permanent-magnet.

25. A driving apparatus according to claim 23, wherein said coil element comprises a core made of a combination of a permanent-magnet and an iron member.

26. A method of supporting a table with a stage used for exposing a substrate, a first magnet and a second magnet spaced from the first magnet coupled to one of the table and the stage, and a magnetic flux driver coupled to the other of the table and the stage and disposed between the first magnet and the second magnet, the method comprising:

detecting a position of the surface of a substrate on said table; and facing same poles of said first magnet and said magnetic flux driver and facing opposite poles of said second magnet and said magnetic flux driver in accordance with said detected position.

27. A method according to claim 26, wherein the magnetic flux driver is an electromagnetic flux driver, the method further comprising controlling an amount of current through the electromagnetic flux driver in accordance with a weight of the table.

28. A method of controlling a position of an object by driving with a driving apparatus a second member relative to a first member using a magnetic force, the driving apparatus including at least one driving unit having a pair of permanent-magnets coupled to one of the first member and the second member and a magnetic flux driver with a coil element coupled to the other of the first member and the second member and disposed between the pair of permanent magnets, the method comprising:

facing same poles of one of the pair of permanent-magnets and the magnetic flux driver and facing opposite poles of the other of the pair of permanent-magnets and the magnetic flux driver in accordance with the position of the object.

29. A method according to claim 28, wherein the magnetic flux driver is an electromagnetic flux driver, the method further comprising controlling an amount of current through the electromagnetic flux driver to thereby drive the second member relative to the first member.

30. A method according to claim 29, wherein the driving apparatus comprises a plurality of driving units for controlling a position of the object in at least three directions corresponding to at least Z, Xθ and Yθ, the method further comprising controlling an amount of current through the electromagnetic flux drivers in accordance with a desired position of the object.

31. A method according to claim 29, wherein the driving apparatus comprises six driving units for driving the table in directions of six degrees of freedom, the method further comprising controlling an amount of current through the electromagnetic flux drivers in accordance with a desired position of the object.

* * * * *